(12) United States Patent
Eid et al.

(10) Patent No.: US 9,275,969 B2
(45) Date of Patent: Mar. 1, 2016

(54) OPTICAL INTERCONNECT ON BUMPLESS BUILD-UP LAYER PACKAGE

(71) Applicant: Intel Corporation, Santa Clara, CA (US)

(72) Inventors: Feras Eid, Chandler, AZ (US); Johanna Swan, Scottsdale, AZ (US); Weng Hong Teh, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/717,185

(22) Filed: Dec. 17, 2012

(65) Prior Publication Data

US 2014/0169800 A1      Jun. 19, 2014

(51) Int. Cl.

| | | |
|---|---|---|
| *H01L 27/15* | (2006.01) | |
| *H01L 31/12* | (2006.01) | |
| *H01L 23/00* | (2006.01) | |
| H01L 25/16 | (2006.01) | |
| H01S 5/022 | (2006.01) | |
| H01S 5/183 | (2006.01) | |

(52) U.S. Cl.
CPC .............. *H01L 24/18* (2013.01); *H01L 25/167* (2013.01); *H01S 5/02248* (2013.01); *H01S 5/02276* (2013.01); *H01S 5/02284* (2013.01); *H01S 5/02292* (2013.01); *H01S 5/183* (2013.01)

(58) Field of Classification Search
CPC ....... H01L 27/15; H01L 31/12; H01L 31/153; H01L 21/50; H01L 25/07; H01L 21/60; H04B 1/12
See application file for complete search history.

(56) References Cited

U.S. PATENT DOCUMENTS

| 5,055,698 | A | * | 10/1991 | Borden ........................ 250/574 |
| 6,005,262 | A | * | 12/1999 | Cunningham et al. .......... 257/84 |
| 2005/0063634 | A1 | * | 3/2005 | Cohen et al. ..................... 385/14 |
| 2009/0175307 | A1 | * | 7/2009 | Ryu et al. ................... 372/50.21 |
| 2009/0238577 | A1 | * | 9/2009 | Tamanuki et al. ............ 398/141 |
| 2009/0323748 | A1 | * | 12/2009 | Nobuhara .................. 372/43.01 |

* cited by examiner

*Primary Examiner* — David Vu
*Assistant Examiner* — Mouloucoulaye Inoussa
(74) *Attorney, Agent, or Firm* — Schwegman Lundberg & Woessner, P.A.

(57) ABSTRACT

This disclosure relates generally to an electronic package that can include a die and a dielectric layer at least partially enveloping the die. Electrical interconnects can be electrically coupled to the die and passing, at least in part, through the dielectric layer. An optical emitter can be electrically coupled to the die with a first one of the electrical interconnects and configured to emit light from a first major surface of the electronic package. A solder bump can be electrically coupled to the die with a second one of the electrical interconnects and positioned on a second major surface of the electronic package different from the first major surface.

24 Claims, 5 Drawing Sheets

OPTICAL INTERCONNECT ON BUMPLESS BUILD-UP LAYER PACKAGE

TECHNICAL FIELD

The disclosure herein relates generally to an optical interconnect on a bumpless build-up layer package and methods therefor.

BACKGROUND ART

Electronic packages have long utilized a variety of modes for transmitting and receiving information from a die contained within the package. Electrical interconnects provide electrical connectivity within the package between the die and the various communication components that can be utilized to transmit and receive electronic signals from and to the die. One such communication component is a conventional solder bump, configured to create a physical electrical connection between the package and another electronic device that communicates with the die. Another such communication component is an optical emitter, such as can be utilized in an optical coupler, that allows for communication utilizing light emission without necessitating a direct physical connection between the package and the communication destination.

DESCRIPTION OF THE EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Conventionally, optical emitters, such as vertical cavity surface emitting lasers, are wire bonded components. In various examples, to enable the solder bumps to be positioned on the same side of the package as the die, a vertical cavity surface emitting laser is backside emitting, in which the light emitting surface is on the side of the package opposite the surface with the solder bumps. As vertical cavity surface emitting lasers may be more plentiful and inexpensive in a frontside configuration, such vertical cavity surface emitting lasers may either be substantially incompatible with such package configurations or may be relatively expensive or rare. Additionally, owing to the use of wires within wire bonding technology and to the desire or need for optical access in optical interconnects, embedding the die completely in the package, such as can be the case with standard bumpless build up layer technology may be incompatible for use with optical interconnections using optical emitters.

New methodologies for building packages have been developed that allow for the use of either frontside or backside vertical cavity surface emitting lasers in the package. More generally, a bumpless buildup layer package has been developed that allows for the incorporation of optical interconnects and optical emitters in general. By taking advantage of an etching process, a cavity can be formed in the dielectric of a package that allows an optical emitter to emit light from a first major surface of the package to provide optical interconnection while solder bumps on a second major surface allow for physical electrical coupling.

Figure 1:
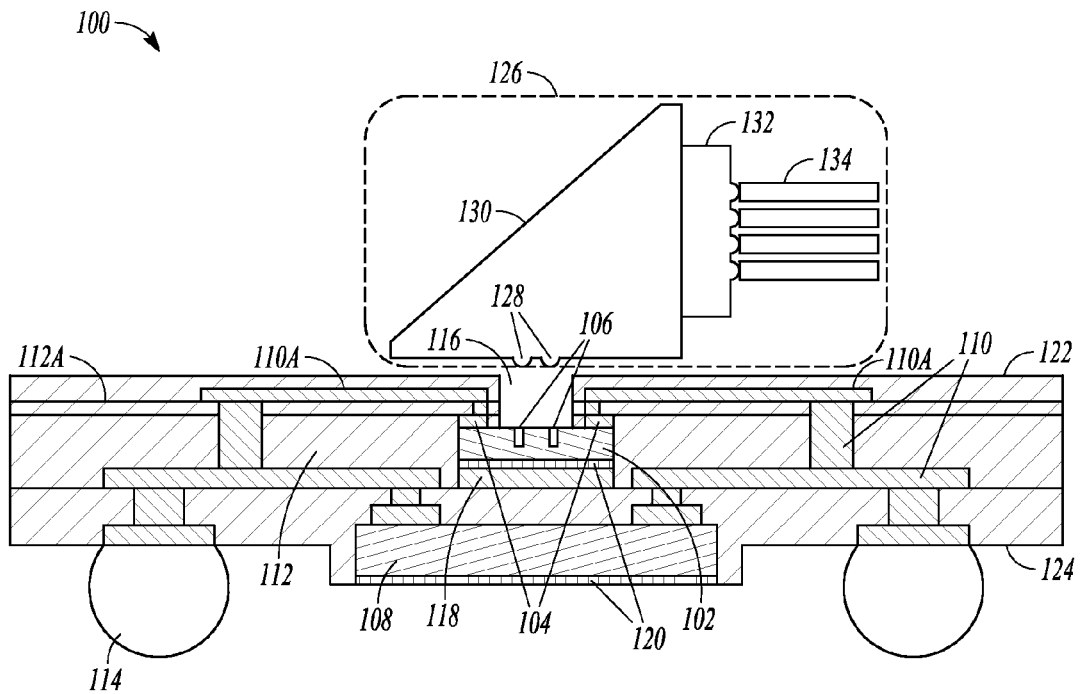
FIG. 1 is a package with a frontside vertical cavity surface emitting laser.

FIG. 1 is a side profile of a package 100 including a frontside vertical cavity surface emitting laser (VCSEL) 102. As is understood in the art, the "front" side of a VCSEL is the side that includes the electrical connects 104 for the VCSEL 102. As the light emitting apertures 106 are positioned on the same side as the electrical connects 104, the VCSEL 102 is thereby a frontside VCSEL 102. In various examples, the frontside VCSEL 102 is either a standard off-the-shelf VCSEL or is a proprietary design. In various examples, alternative optical emitters can be utilized, including photonic systems that utilize silicon as the optical medium and light emitting diodes (LEDs).

The package 100 includes a die 108 coupled to the electrical connects 104 of the VCSEL with conductive lines 110. In various examples, the die 108 is a silicon die fabricated according to various methods to perform various electronic and computational tasks. In various examples, the conductive lines 110 are made from copper or other material known or yet to be developed that is useful to conduct electrical signals. For the purposes of this disclosure, the conductive lines 110 are understood to include conductive layers as well as vias between the conductive layers, both well understood in the art.

The conductive lines 110 are physically separated and, in various examples, mechanically supported by an insulator 112. The insulator 112 can include separately formed layers of a material, such as a dielectric, that is substantially non-conductive of electrical signals to a degree that would be understood by one of ordinary skill in the art. In various examples, the material of the insulator 112 can be and is laminated.

The package 100 includes at least one solder bump 114 electrically coupled to the die 108 with a conductive line 110. In various examples, the solder bump 114 is not necessarily made of solder and instead is any electrical connection that allows for a physical electrical connection between the package 100 and an external component, such as a circuit board or socket. In an example, the package 100 can output data via at least the VCSEL 102 and the solder bump 114.

In order to seat and mechanically secure a frontside VCSEL 102, in which the electrical connects 104 and the aperture 106 are on the same side of the VCSEL 102, a cavity 116 is formed in the insulator 112 of approximately comparable length and width as the VCSEL 102, and the VCSEL 102 is seated in the cavity 116. The cavity 116 can be formed in the insulator 112 according to any suitable methodology. In various examples, the cavity 116 is formed according to various etching processes. In various examples, the cavity 116 is formed according to a plasma etching process, by sandblasting the insulator 112, or by photo-exposing and then directly developing a photosensitive dielectric used as the insulator 112. The package 100 optionally includes an etch stop 118 to block or inhibit further etching upon the etching reaching the etch stop 118. The etch stop 118 can be made of material that is resistant to whatever etching material or process that is utilized to form the cavity 116, such as copper. In an example, the etch stop 118 is a "dummy" conductive line 110 that is not necessarily coupled to an input or output of or within the package 100.

In the illustrated example, the conductive lines 110A that couple to the electrical connects 104 of the VCSEL 102 are formed after the VCSEL 102 is positioned in the cavity 116. Upon forming the conductive lines 110A, a top insulator layer 112A is formed to insulate and at least partially mechanically secure the conductive lines 110A. In various alternative examples, the cavity 116 is formed in a single action and conductive lines 110 and the top insulator layer 112A are not formed after the formation of the cavity 116. In various alternative examples, the cavity 116 is not formed through the removal of insulator layer 112 material but rather through forming the insulator layer 112 around the space of the cavity 116.

The VCSEL 102 can be secured, at least in part, with the conductive lines 110A. Additionally, the formation of the insulator 112 can provide mechanical support to the VCSEL 102, such as by enclosing the VCSEL 102 in a cavity 116 that has an opening smaller than the length and/or width of the VCSEL 102. In various examples, the package 100 further optionally includes a die attach film 120 to provide mechanical support to the VCSEL 102 and the die 108. The die attach film 120 can be applied to the VCSEL 102 prior to inserting the VCSEL 102 into the cavity 116 or otherwise securing the VCSEL 102 to the insulator 112 specifically or the package 100 generally.

The package 100 thereby has a first major surface 122 from which light emitted from the VCSEL 102 originates and an opposite second major surface 124 on which the solder bump 114 is positioned. The light from the VCSEL 102 travels substantially perpendicular to the first major surface 122. In various examples, the major surfaces 122, 124 need not be opposite one another, such as in examples in which the major surfaces 122, 124 are orthogonal with respect to one another. However, in certain such examples, the package 100 can be configured so that the light output of the VCSEL 102 can be accessed when the solder bump 114 is electrically coupled to an external electronic device.

The package 100 optionally includes an optical interconnect 126 configured to facilitate the transmission of light form the VCSEL 102. In various examples, the optical interconnect 126 can optionally include, as appropriate, one or more lenses 128 configured to receive light emitted from the VCSEL 102, a prism 130 or other coupler configured to re-direct light, and a coupler 132 and optical transmitter 134, such as an optical fiber, configured to transmit the light sufficiently coherent that integrity of the data included in the emitted light is maintained during transmission to a destination receptor or detector. In various examples, multiple lenses 128 can be used to collimate or make substantially parallel light emitted from the VCSEL 102 in anticipation of transmission of the light along the optical transmitter 134.

Figure 2:
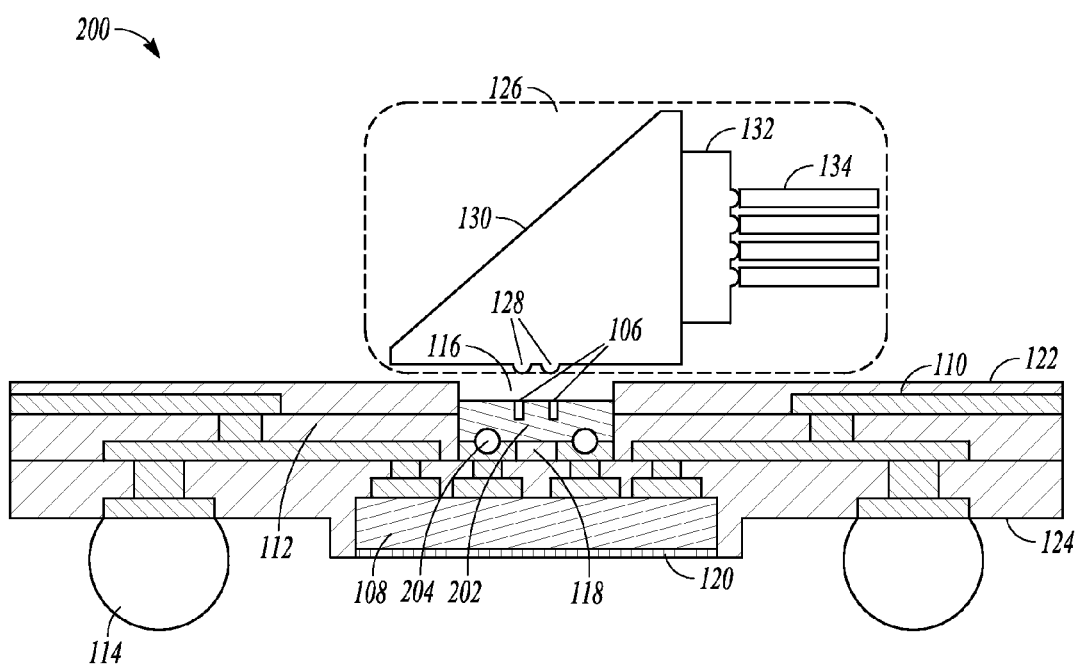
FIG. 2 is a package with a backside vertical cavity surface emitting laser.

FIG. 2 is a side profile of a package 200 including a backside vertical cavity surface emitting laser (VCSEL) 202. As the light emitting apertures 206 are positioned on the opposite side as the electrical connects 204, the VCSEL 202 is thereby a backside VCSEL 202. In various examples, the backside VCSEL 202 is either a standard off-the-shelf VCSEL or is a proprietary design. As with the package 200, in various examples, alternative optical emitters can be utilized, including photonic systems that utilize silicon as the optical medium and light emitting diodes (LEDs).

In various examples, apart from the backside VSCEL 202, the package 200 can incorporate the same or otherwise similar componentry to that of the package 100. The die 108, conductive lines 110, insulator 112, and solder bump 114 can be the same or essentially the same in the package 200 as in the package 100. The cavity 216 can similarly be formed as discussed in detail above with respect to the cavity 116. The function of the etch stop 118 can be supplemented by the connects 204 or can be dispensed with altogether in various examples. Because the connects 204 can provide mechanical stability for the VCSEL 202 during manufacture of the package 200, the die attach film 120 may be utilized with respect to the die 108 but not the VCSEL 202. In various examples, the die attach film 120 may be utilized with respect to the VCSEL 202 as well.

In the illustrated example, because conductive lines 110 do not need to reach an external surface of the VCSEL 202, the cavity can be of an essentially identical length and width as the VCSEL 202. In contrast to various examples of the insulator 112 of the package 100, the insulator 112 of the package 200 may not necessarily be formed in a stage or layer after the VCSEL 202 is coupled to the package 200. Consequently, in various examples, etching or other cavity formation method may be performed after the formation of the complete insulator 112.

The package 200 retains the perpendicular or essentially perpendicular emission of light from the first major surface 122 while the physical electrical connection occurs by way of the solder bump 114 on the second major surface 124. As with the package 100, the major surfaces 122, 124 can be on opposite sides of the package 200, though various arrangements can places the major surfaces 122, 124 in orientations other than parallel with respect to one another, such as an orthogonal orientation. The lack of obstruction of the physical interconnection with an external electronic component may support the incorporation of the optical interconnect 126 with respect to the first major surface 122.

FIGS. 3A-3F illustrate a sequential process flow for making the package 100 utilizing frontside VSCEL 102. The process flow may further be utilized for making a variety of packages, while the package 100 itself may be made according to any suitable process.

Figure 3A:
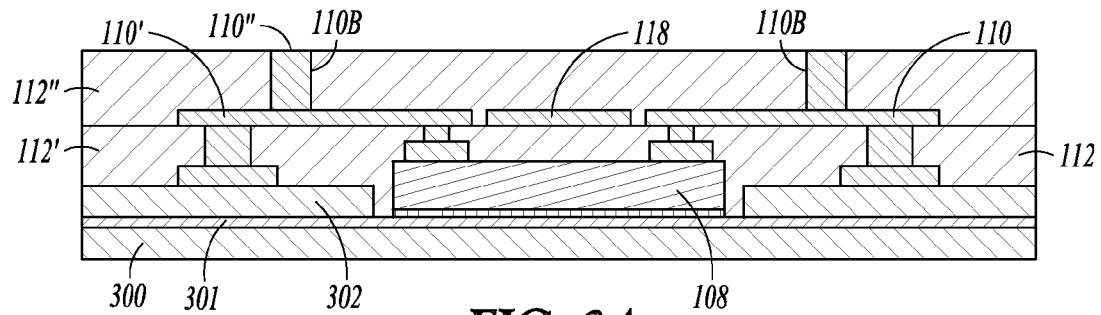
FIGS. 3A-3F are a sequential process flow for making the package with a frontside vertical cavity surface emitting laser.

In FIG. 3A, the package 100 is substantially formed or otherwise provided. The conductive lines 110 and insulator 112 are formed with respect to the die 108. The etch stop 118 can also be formed, such as by creating a dummy conductive line 110. It is noted that, in various conventional die packages that do not necessarily utilize the methodologies disclosed herein, a solder bump may be positioned on the exposed conductive lines 110B. In various examples, dry film patterning may be applied to facilitate creating the cavity 116.

In various examples, the insulator 112 is formed through a buildup process of separately and sequentially applying or laminating layers 112', 112" of insulative material. In such an example, the conductive lines 110 can be formed by sequentially creating conductive layers 110' and vias 110" in sequence with the formation of the dielectric insulation layers 112', 112". Buildup support components, such as a long copper foil 300, a dielectric film 301, and a cavity copper foil 302, can be utilized to support the buildup process.

In various examples, the dielectric film 301 is a low-modulus laminate film configured to act as an etch stop in examples where the long copper foil 300 is removed through an etching process. In such examples, the dielectric film 301 is ultimately removed, such as through sandblasting. In various examples, the cavity copper foil 302 is removable through wet etching.

Figure 3B:
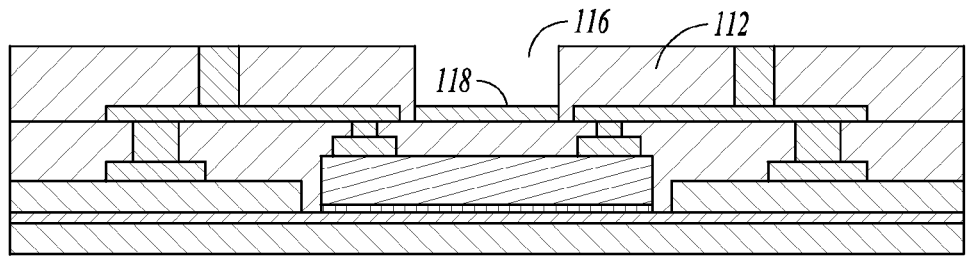

In FIG. 3B, the cavity 116 is formed in the insulator 112. In various examples, the cavity 116 is formed according to methodologies described above, such as etching. In various examples, the cavity is formed to be at least as wide and long as the VSCEL 102, as is formed to extend at least as deep as the etch stop 118.

Figure 3C:
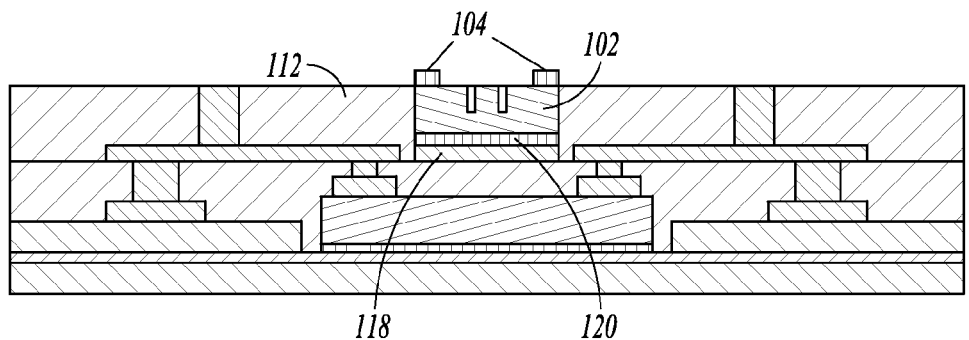

In FIG. 3C, the VSCEL 102 is inserted into the cavity 116. In various examples, the VSCEL 102 is at least partially mechanically adhered by the die attach film 120. The die attach film 120 can have come pre-attached to the VSCEL 102 or can have been previously applied to the etch stop 118 or other surface within the cavity 116. The cavity 116 may have been sized so that the connects 104 are exposed flush with or, in the illustrative example, above the insulator 112 so as to facilitate subsequent electrical coupling with the connects 104.

Figure 3D:
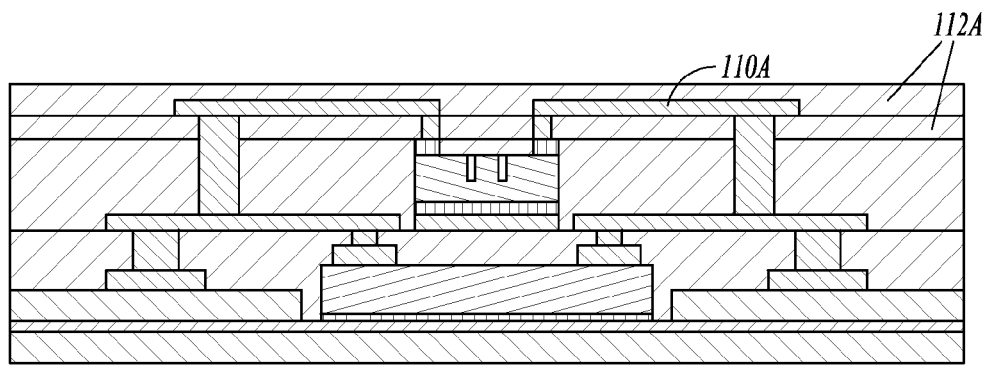

In FIG. 3D, the conductive lines 110A are electrically coupled to the connects 104 and the insulator layer 112A is applied. In various examples, the conductive lines 110A and the insulator layer 112A are applied in stages according to sequential buildup procedures, as described herein.

Figure 3E:
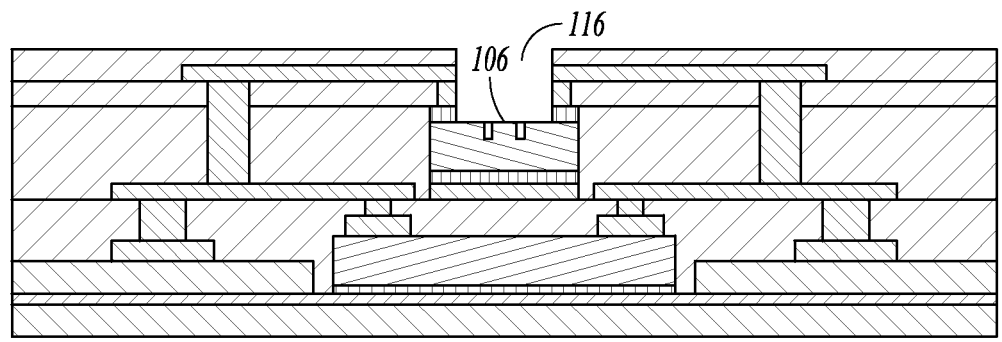

In FIG. 3E, the cavity 116 is expanded to provide optical access to the apertures 106. The cavity 116 may be expanded using the same techniques described above with respect to FIG. 3B above and throughout. In an example, dry film resist and etching may be utilized to expand the cavity 116.

Figure 3F:
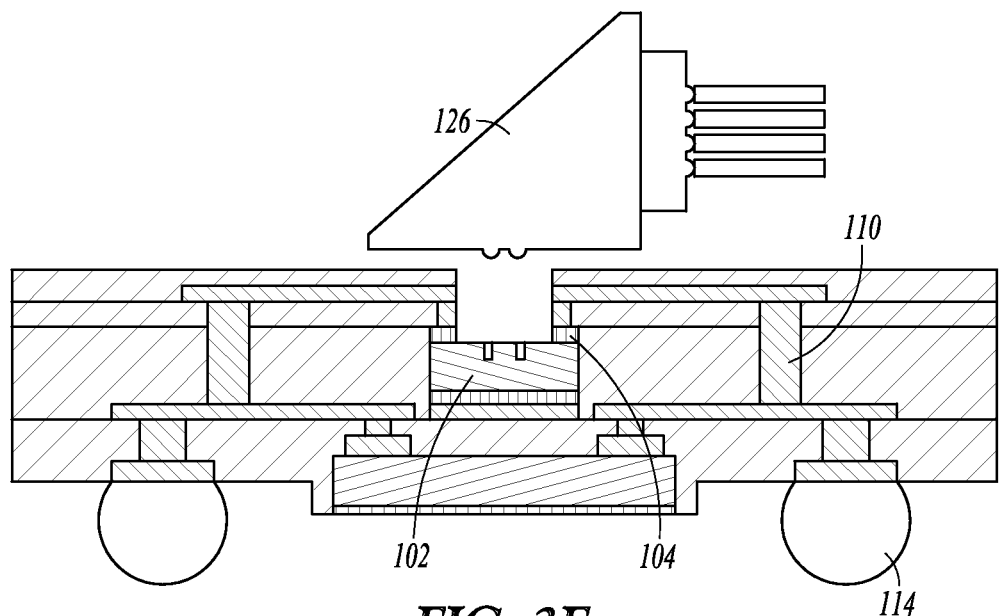

In FIG. 3F, the long copper foil 300, dielectric film 301, and cavity copper foil 302 are removed, such as in the manners detailed above, the solder bumps 114 are applied, and the optical interconnect 126 is coupled to complete the package 100. As illustrated, the conductive lines 110 couple the connects 104, the die 108 and the solder bumps 114, meaning that the output on a solder bump 114 is the same as the output of the VCSEL 102. In various examples, the VCSEL 102 and solder bumps 114 are not electrically coupled with respect to one another.

FIGS. 4A-4D illustrate a sequential process flow for making the package 200 utilizing a backside VSCEL 202. The process flow may further be utilized for making a variety of packages, while the package 200 itself may be made according to any suitable process.

Figure 4A:
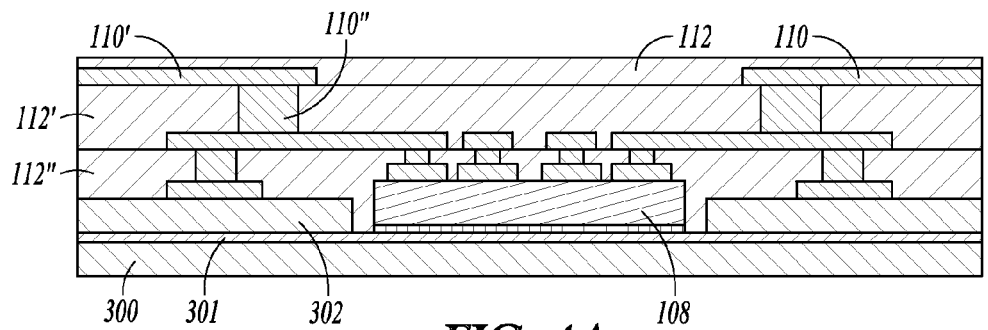
FIGS. 4A-4D are a sequential process flow for making the package with a backside vertical cavity surface emitting laser.

In FIG. 4A, the package 200 is substantially formed or otherwise provided. The conductive lines 110 and insulator 112 are formed with respect to the die 108. The etch stop 118 that may be included in the package 100 may be omitted owing to the existing structure of the conductive lines 110. As illustrated and in further contrast to the package 100, the conductive lines 110 and insulator 112 may be entirely or substantially fully formed prior to forming the cavity 116.

In various examples, the insulator 112 is formed through a buildup process of separately and sequentially applying or laminating layers 112', 112" of insulative material. In such an example, the conductive lines 110 can be formed by sequentially creating conductive layers 110' and vias 110" in sequence with the formation of the dielectric insulation layers 112', 112". Buildup support components, such as a long copper foil 300, dielectric film 301, and cavity copper foil 302, can be utilized to support the buildup process, detailed above.

Figure 4B:
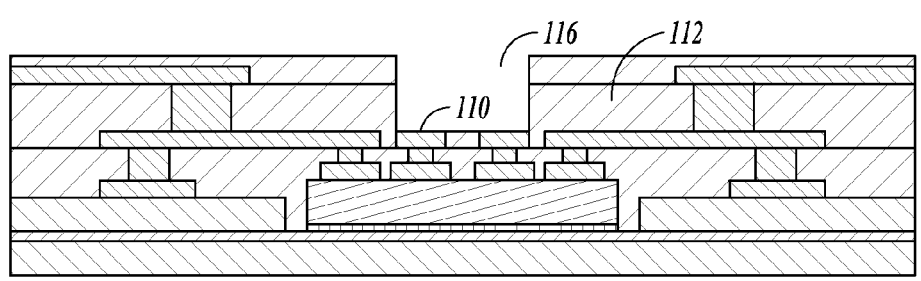

In FIG. 4B, the cavity 116 is formed in the insulator 112. In various examples, the cavity 116 is formed according to methodologies described above, such as etching. In various examples, the cavity is formed to be at least as wide and long as the VSCEL 202, as is formed to extend at least as deep as the conductive lines 110.

Figure 4C:
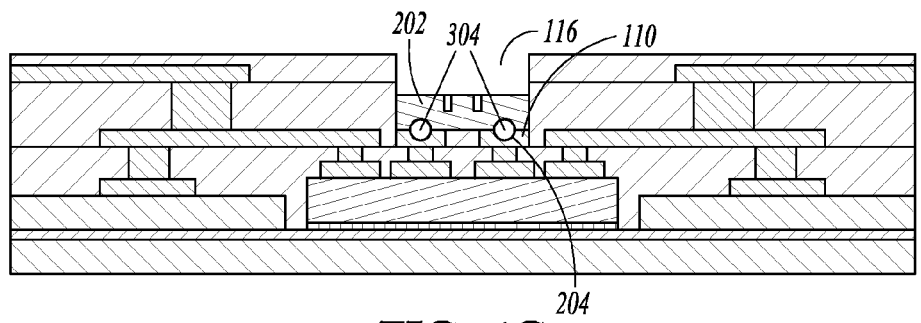

In FIG. 4C, the VSCEL 202 is inserted into the cavity 116. In various examples, the VSCEL 202 is at least partially mechanically secured by electrically coupling the connects 204 to the conductive lines 110. The connects 204 can be electrically coupled with solder balls 304 or by other electrical coupling methodologies.

Figure 4D:
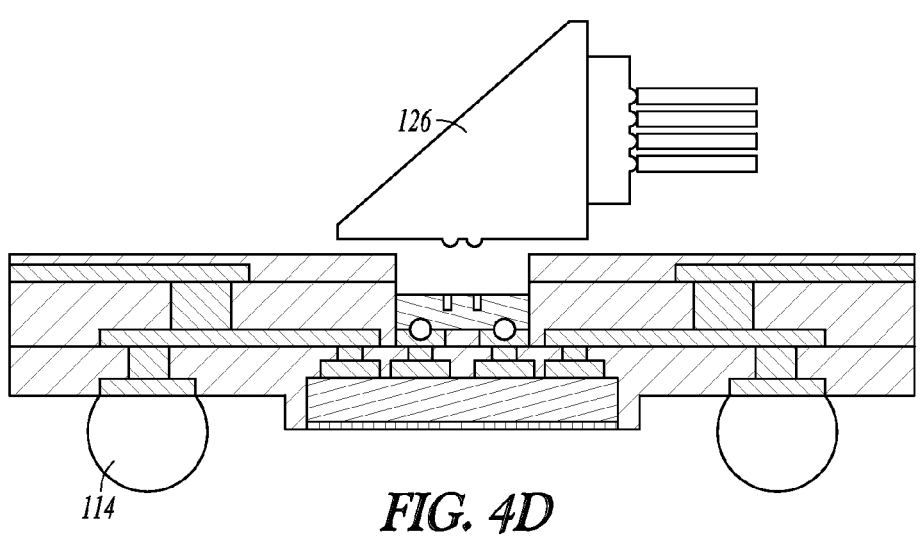

In FIG. 4D, the long copper foil 300, the dielectric film 301, and cavity copper foil 302 are removed, the solder bumps 114 are applied, and the optical interconnect 126 is coupled to complete the package 200. As illustrated, and in contrast to the package 100, the conductive lines 110 do not interconnect the solder bumps 114 with the connects 204 of the VCSEL 202. In various examples, the VCSEL 202 and solder bumps 114 are electrically coupled with respect to one another, as in the package 100.

Figure 5:
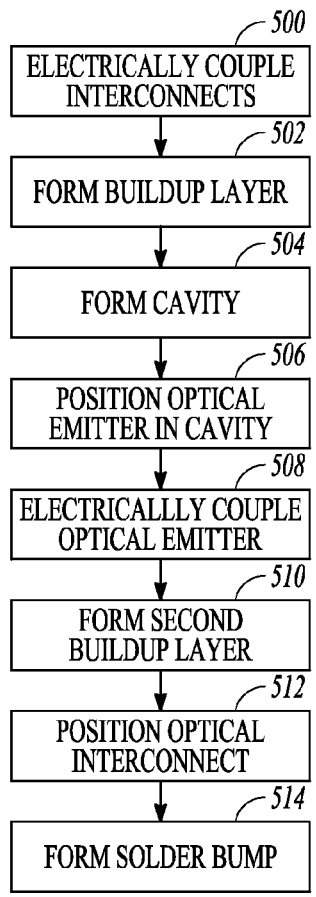
FIG. 5 is a flowchart for making a package.

FIG. 5 is a flowchart for making the package 100, 200. The flowchart may be applied to the creation of a variety of packages or other electronic devices in addition to the package 100, 200. Additionally, the package 100 may alternatively be made according to any of a variety of suitable methods.

At 500, electrical interconnects, such as conductive lines 110, are electrically coupled to the die 108.

At 502, a buildup layer, such as the insulator 112, is formed. In an example, the buildup layer 112 is a dielectric layer made up of a dielectric material. The dielectric layer at least partially or substantially envelops the die 108 and the electrical interconnects 110. In various examples, 500 and 502 occur iteratively, with individual electrical interconnect layers 110', 110" and dielectric layers 112', 112" added in discrete stages. In an example, 500 and 502 iteratively alternate multiple times until the electrical interconnects 110 and dielectric layer 112 reach a predetermined stage, such as may be illustrated in FIGS. 3A and 4A.

At 504, the cavity 116 is formed according to methodologies, such as are disclosed herein. In various examples, etching, such as plasma etching, is utilized to form the cavity 116. In an example, dry film patterning is also utilized.

At 506, an optical emitter, such as frontside VSCEL 102 or backside VSCEL 202, is positioned within the cavity 116.

At 508, the optical emitter 102, 202 is electrically coupled to a first one of the electrical interconnects 110. The optical emitter 102, 202 is thereby electrically coupled to the die 108 and is configured to emit light from the first major surface 122 of the package 100, 200. In an example, the optical emitter 102, 202 is configured to emit light substantially perpendicular to the first major surface 122. In an example, the optical emitter is configured to emit light according to a communication modality, such as to communicate information from the die 108 to a component external to the package 100, 200.

At 510, in the case of the package 100, where the electrical interconnect 110A projects, at least in part, from the dielectric layer 112, a second dielectric layer 112A is formed that at least partially or substantially envelops the electrical interconnect 110A and forms, at least in part, the cavity 116.

At 512, the optical interconnect 126 is positioned with respect to the optical emitter 102, 202. In various examples, the optical interconnect 126 is configured to support communication according to the communication modality from the optical emitter 102, 202. A lens 128 of the optical interconnect 126 is configured to receive light emitted from the optical emitter 102, 202. An optical transmitter 134 is configured to transmit light transmitted by the optical emitter 102, 202 and received by the lens 128 to an optical detector. The optical interconnect 126 optionally further includes a plurality of lenses 128 configured to receive and collimate the light emitted from the optical emitter 102, 202. The optical interconnect 126 optionally further includes a prism 130 configured to direct the light received by the lens or lenses 128 in a direction other than substantially perpendicular to the first major surface 122.

At 514, a solder bump 114 is coupled to a second one of the interconnects 110 and electrically coupled to the die 108. The solder bump 114 is positioned on the second major surface 124 of the package 100. In an example, the second major surface 124 is opposite the first major surface 122.

Figure 6:
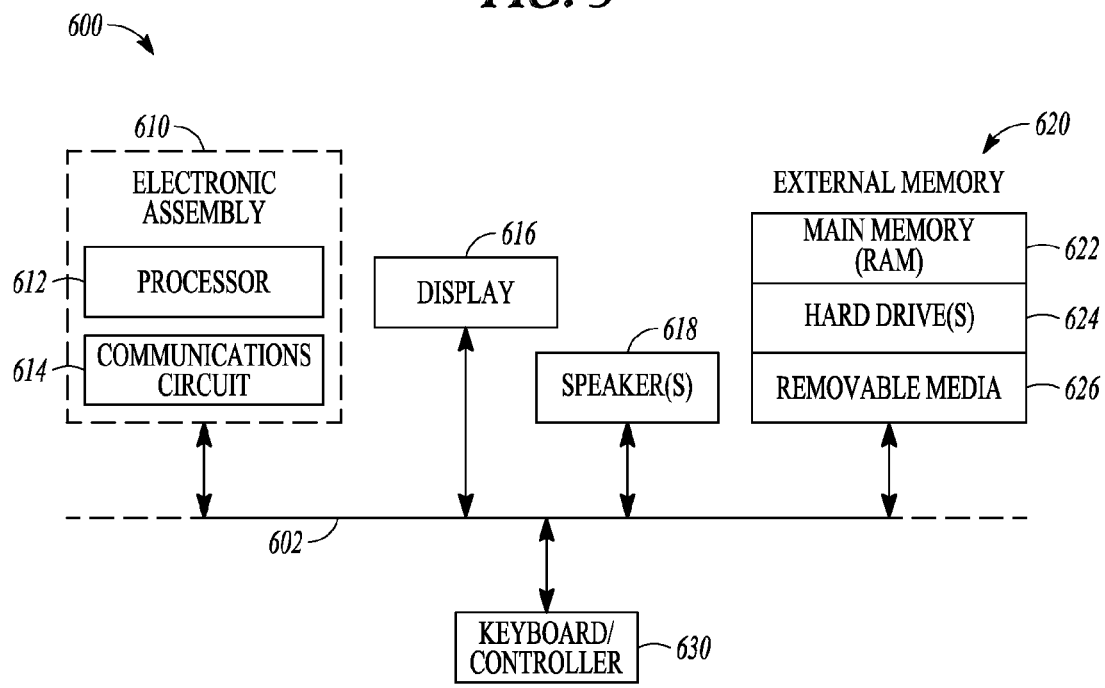
FIG. 6 is a block diagram of an electronic device incorporating at least one package.

An example of an electronic device using semiconductor chips and elongated structures as described in the present disclosure is included to show an example of a higher level device application for the present invention. FIG. 6 is a block diagram of an electronic device 600 incorporating at least one package, such as package 100, 200 or other package described in examples herein. The electronic device 600 is merely one example of an electronic system in which embodiments of the present invention can be used. Examples of electronic devices 600 include, but are not limited to personal computers, tablet computers, mobile telephones, personal data assistants, MP3 or other digital music players, etc. In this example, the electronic device 600 comprises a data processing system that includes a system bus 602 to couple the various components of the system. The system bus 602 provides communications links among the various components of the electronic device 600 and can be implemented as a single bus, as a combination of busses, or in any other suitable manner.

An electronic assembly 610 is coupled to the system bus 602. The electronic assembly 610 can include any circuit or combination of circuits. In one embodiment, the electronic assembly 610 includes a processor 612 which can be of any type. As used herein, "processor" means any type of computational circuit, such as but not limited to a microprocessor, a microcontroller, a complex instruction set computing (CISC) microprocessor, a reduced instruction set computing (RISC) microprocessor, a very long instruction word (VLIW) microprocessor, a graphics processor, a digital signal processor (DSP), multiple core processor, or any other type of processor or processing circuit.

Other types of circuits that can be included in the electronic assembly 610 are a custom circuit, an application-specific integrated circuit (ASIC), or the like, such as, for example, one or more circuits (such as a communications circuit 614) for use in wireless devices like mobile telephones, pagers, personal data assistants, portable computers, two-way radios, and similar electronic systems. The IC can perform any other type of function.

The electronic device 600 can also include an external memory 620, which in turn can include one or more memory elements suitable to the particular application, such as a main memory 622 in the form of random access memory (RAM), one or more hard drives 624, and/or one or more drives that handle removable media 626 such as compact disks (CD), digital video disk (DVD), and the like.

The electronic device 600 can also include a display device 616, one or more speakers 618, and a keyboard and/or controller 630, which can include a mouse, trackball, touch screen, voice-recognition device, or any other device that permits a system user to input information into and receive information from the electronic device 600.

ADDITIONAL EXAMPLES

Example 1 may include subject matter (such as an apparatus, a method, a means for performing acts) that can include a method of making a package. The method may comprise electrically coupling electrical interconnects to a die, forming a dielectric layer that at least partially envelops the die and the electrical interconnects, electrically coupling an optical emitter to a first one of the electrical interconnects, wherein the optical emitter is electrically coupled to the die, and wherein the optical emitter is configured to emit light from a first major surface of the package, and forming a solder bump coupled to a second one of the electrical interconnects and electrically coupled to the die, wherein the solder bump is positioned on a second major surface of the package.

In Example 2, the method of Example 1 can optionally further include that the second major surface is opposite the first major surface.

In Example 3, the method of any one or more of Examples 1 and 2 can optionally further include that the optical emitter is configured to emit light substantially perpendicular to the first major surface.

In Example 4, the method of any one or more of Examples 1-3 can optionally further include positioning an optical interconnect with respect to the optical emitter, the optical interconnect comprising a lens configured to receive light emitted from the optical emitter and an optical transmitter configured to transmit the light emitted from the optical emitter to an optical detector.

In Example 5, the method of any one or more of Examples 1-4 can optionally further include that the optical emitter is configured to emit light according to a communication modality.

In Example 6, the method of any one or more of Examples 1-5 can optionally further comprise an optical interconnect that further comprises a plurality of lenses configured to receive and collimate the light emitted from the optical emitter and a prism configured to direct the light received by the plurality of lenses in a direction other than substantially perpendicular to the first major surface.

In Example 7, the method of any one or more of Examples 1-6 can optionally further comprise forming a cavity in the dielectric layer and positioning the optical emitter within the cavity.

In Example 8, the method of any one or more of Examples 1-7 can optionally further include that the dielectric layer comprises a dielectric material, and wherein forming the cavity comprises etching the cavity in the dielectric material of the dielectric layer, sandblasting the dielectric material, and photo-exposing and developing the dielectric material.

In Example 9, the method of any one or more of Examples 1-8 can optionally further include that the optical emitter is a vertical cavity surface emitting laser.

In Example 10, the method of any one or more of Examples 1-9 can optionally further include that the vertical cavity surface emitting laser is a frontside emitting vertical cavity surface emitting laser, that the dielectric layer is a first dielectric layer, that the first electrical interconnect projects, at least in part, from the first dielectric layer relative to the first surface, and can further comprise forming a second dielectric layer at least partially enveloping the first electrical interconnect and forming, at least in part, the cavity.

Example 11 may include subject matter (such as an apparatus, a method, a means for performing acts) that can include an electronic package that comprises a die, a dielectric layer at least partially enveloping the die, electrical interconnects electrically coupled to the die and passing, at least in part, through the dielectric layer, an optical emitter electrically coupled to the die with a first one of the electrical interconnects and configured to emit light from a first major surface of the electronic package, and a solder bump electrically coupled to the die with a second one of the electrical interconnects and positioned on a second major surface of the electronic package different from the first major surface.

In Example 12, the device of Example 11 can optionally further include that the second major surface is opposite the first major surface.

In Example 13, the device of any one or more of Examples 11 and 12 can optionally further include that the optical emitter is configured to emit light substantially perpendicular to the first major surface.

In Example 14, the device of any one or more of Examples 11-13 can optionally further comprise an optical interconnect comprising a lens configured to receive light emitted from the optical emitter and an optical transmitter configured to transmit the light emitted from the optical emitter to an optical detector.

In Example 15, the device of any one or more of Examples 11-14 can optionally further include that the optical emitter is configured to emit light according to a communication modality.

In Example 16, the device of any one or more of Examples 11-15 can optionally further include that the optical interconnect further comprises a plurality of lenses configured to receive and collimate the light emitted from the optical emitter and a prism configured to direct the light received by the plurality of lenses in a direction other than substantially perpendicular to the first major surface.

In Example 17, the device of any one or more of Examples 11-16 can optionally further include that the optical emitter is seated within a cavity in the dielectric layer.

In Example 18, the device of any one or more of Examples 11-17 can optionally further include that the optical emitter is a semiconductor optical emitter.

In Example 19, the device of any one or more of Examples 11-18 can optionally further include that the optical emitter is a vertical cavity surface emitting laser.

In Example 20, the device of any one or more of Examples 11-19 can optionally further include that the vertical cavity surface emitting laser is chosen from a group consisting of a frontside emitting vertical cavity surface emitting laser and a backside emitting vertical cavity surface emitting laser.

Each of these non-limiting examples can stand on its own, or can be combined with one or more of the other examples in any permutation or combination.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A method of making a chip package, comprising:
    electrically coupling electrical interconnects to a silicon die; then
    forming a dielectric material into a buildup layer that substantially surrounds the silicon die and the electrical interconnects;
    electrically coupling an optical emitter to a first one of the electrical interconnects, wherein the optical emitter is electrically coupled to the silicon die, and wherein the optical emitter is configured to emit light from a first major surface of the chip package; and
    forming a solder bump coupled to a second one of the electrical interconnects and electrically coupled to the silicon die, wherein the solder bump is positioned on a second major surface of the chip package.

2. The method of claim 1, wherein the second major surface is opposite the first major surface.

3. The method of claim 1, wherein the optical emitter is configured to emit light substantially perpendicular to the first major surface.

4. The method of claim 3, further comprising positioning an optical interconnect with respect to the optical emitter, the optical interconnect comprising:
    a lens configured to receive light emitted from the optical emitter; and
    an optical transmitter configured to transmit the light emitted from the optical emitter to an optical detector.

5. The method of claim 4, wherein the optical emitter is configured to emit light according to a communication modality.

6. The method of claim 4, wherein the optical interconnect further comprises:
    a plurality of lenses configured to receive and columnate the light emitted from the optical emitter; and
    a prism configured to direct the light received by the plurality of lenses in a direction other than substantially perpendicular to the first major surface.

7. The method of claim 1, further comprising:
    forming a cavity in the buildup layer; and
    positioning the optical emitter within the cavity.

8. The method of claim 7, wherein forming the cavity comprises etching the cavity in the dielectric material of the buildup layer.

9. The method of claim 7, wherein the optical emitter is a vertical cavity surface emitting laser.

10. An electronic chip package, comprising:
a silicon die;
a dielectric material formed into a buildup layer substantially surrounding the silicon die;
electrical interconnects electrically coupled to the silicon die and passing, at least in part, through the buildup layer;
an optical emitter electrically coupled to the silicon die with a first one of the electrical interconnects and configured to emit light from a first major surface of the electronic chip package; and
a solder bump electrically coupled to the silicon die with a second one of the electrical interconnects and positioned on a second major surface of the electronic chip package different from the first major surface.

11. The electronic chip package of claim 10, wherein the second major surface is opposite the first major surface.

12. The electronic chip package of claim 10, wherein the optical emitter is configured to emit light substantially perpendicular to the first major surface.

13. The electronic chip package of claim 12, further comprising an optical interconnect comprising:
a lens configured to receive light emitted from the optical emitter; and
an optical transmitter configured to transmit the light emitted from the optical emitter to an optical detector.

14. The electronic chip package of claim 13, wherein the optical emitter is configured to emit light according to a communication modality.

15. The electronic chip package of claim 13, wherein the optical interconnect further comprises:
a plurality of lenses configured to receive and columnate the light emitted from the optical emitter; and
a prism configured to direct the light received by the plurality of lenses in a direction other than substantially perpendicular to the first major surface.

16. The electronic chip package of claim 10, wherein the optical emitter is seated within a cavity in the buildup layer.

17. The electronic chip package of claim 16, wherein the optical emitter is a semiconductor optical emitter.

18. The electronic chip package of claim 17, wherein the optical emitter is a vertical cavity surface emitting laser.

19. A method of making a chip package, comprising:
electrically coupling electrical interconnects to a die; then forming a buildup layer that substantially surrounds the die and the electrical interconnects;
forming a cavity in the buildup layer;
positioning an optical emitter within the cavity;
electrically coupling the optical emitter to a first one of the electrical interconnects, wherein the optical emitter is electrically coupled to the die, and wherein the optical emitter is configured to emit light from a first major surface of the chip package; and
forming a solder bump coupled to a second one of the electrical interconnects and electrically coupled to the die, wherein the solder bump is positioned on a second major surface of the chip package.

20. The method of claim 19, wherein the buildup layer comprises a dielectric material and wherein forming the cavity in the buildup layer includes removing a portion of the dielectric material.

21. The method of claim 20, wherein removing the portion of the buildup layer is via an etching process.

22. The method of claim 20, wherein removing the portion of the buildup layer is via a sandblasting process.

23. The method of claim 20, wherein removing the portion of the buildup layer is via a photo-exposing process.

24. The method of claim 19, wherein the optical emitter is a vertical cavity surface emitting laser.

* * * * *